(12) United States Patent
Eid et al.

(10) Patent No.: US 10,897,238 B2
(45) Date of Patent: Jan. 19, 2021

(54) PIEZOELECTRIC PACKAGE-INTEGRATED CONTOUR MODE FILTER DEVICES

(71) Applicant: Intel Corporation, Santa Clara, CA (US)

(72) Inventors: Feras Eid, Chandler, AZ (US); Georgios C. Dogiamis, Gilbert, AZ (US); Valluri R. Rao, Saratoga, CA (US); Adel A. Elsherbini, Chandler, AZ (US); Johanna M. Swan, Scottsdale, AZ (US); Telesphor Kamgaing, Chandler, AZ (US); Vijay K. Nair, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 1130 days.

(21) Appl. No.: 15/088,987

(22) Filed: Apr. 1, 2016

(65) Prior Publication Data

US 2017/0288642 A1    Oct. 5, 2017

(51) Int. Cl.
  *H03H 9/54*     (2006.01)
  *H03H 9/05*     (2006.01)
  *H03H 9/17*     (2006.01)
  *H03H 9/15*     (2006.01)
  *H03H 9/02*     (2006.01)
  *H03H 9/24*     (2006.01)

(52) U.S. Cl.
  CPC ............ *H03H 9/54* (2013.01); *H03H 9/05* (2013.01); *H03H 9/0542* (2013.01); *H03H 9/17* (2013.01); *H03H 9/173* (2013.01); *H03H 9/2463* (2013.01); *H03H 2009/02503* (2013.01); *H03H 2009/155* (2013.01)

(58) Field of Classification Search
  CPC .. H03H 9/54; H03H 9/05; H03H 9/17; H03H 9/173; H03H 9/0542; H03H 2009/02503; H03H 9/2463; H03H 2009/155
  USPC ........................................ 333/186, 187, 188
  See application file for complete search history.

(56) References Cited

U.S. PATENT DOCUMENTS

| | | | |
|---|---|---|---|
| 7,492,241 B2 | 2/2009 | Gianluca et al. | |
| 7,834,526 B2 | 11/2010 | Yamada | |
| 8,816,567 B2 * | 8/2014 | Zuo ......................... | H03H 3/02 310/321 |

(Continued)

FOREIGN PATENT DOCUMENTS

JP      2011-211347      10/2011

OTHER PUBLICATIONS

International Preliminary Report on Patentablity for International Patent Application No. PCT/US2017/013447, dated Oct. 11, 2018, 13 pages.

(Continued)

*Primary Examiner* — Robert J Pascal
*Assistant Examiner* — Jorge L Salazar, Jr.
(74) *Attorney, Agent, or Firm* — Schwabe, Williamson & Wyatt, P.C.

(57) ABSTRACT

Embodiments of the invention include a filtering device that includes a first electrode, a piezoelectric material in contact with the first electrode, and a second electrode in contact with the piezoelectric material. The piezoelectric filtering device expands and contracts laterally in a plane of an organic substrate in response to application of an electrical signal between the first and second electrodes.

19 Claims, 8 Drawing Sheets

(56) References Cited

U.S. PATENT DOCUMENTS

| | | | |
|---|---|---|---|
| 2003/0227357 A1* | 12/2003 | Metzger | H03H 9/0571 |
| | | | 333/189 |
| 2009/0108381 A1* | 4/2009 | Buchwalter | B81C 1/0023 |
| | | | 257/415 |
| 2011/0187227 A1 | 8/2011 | Chen et al. | |
| 2012/0148870 A1* | 6/2012 | Liu | B81C 1/00269 |
| | | | 428/641 |
| 2016/0036580 A1 | 2/2016 | Shealy | |

OTHER PUBLICATIONS

International Search Report and Written Opinion for International Patent Application No. PCT/US2017/013447, dated Apr. 19, 2017, 16 pages.

* cited by examiner

SECTION A-A'

SECTION B-B'

PIEZOELECTRIC PACKAGE-INTEGRATED CONTOUR MODE FILTER DEVICES

FIELD OF THE INVENTION

Embodiments of the present invention relate generally to package integrated devices. In particular, embodiments of the present invention relate to piezoelectric package integrated contour mode filter devices.

BACKGROUND OF THE INVENTION

Filters are essential components of today's wireless circuits to enable, for example, band selection and frequency tuning. Most filters today are realized using integrated passive (resistor, capacitor, and/or inductor) networks which suffer from large size and high losses due to the quality factors of inductors in addition to the need for additional process steps to assemble those components onto the package substrate. Another utilized approach employs Silicon Micro electromechanical systems (Si-MEMS) based resonators that can be made smaller and have higher quality factors than passive networks; however their fabrication may be cost-prohibitive and they would still require assembly as discrete components to the system or board.

DETAILED DESCRIPTION OF THE INVENTION

Figure 1:
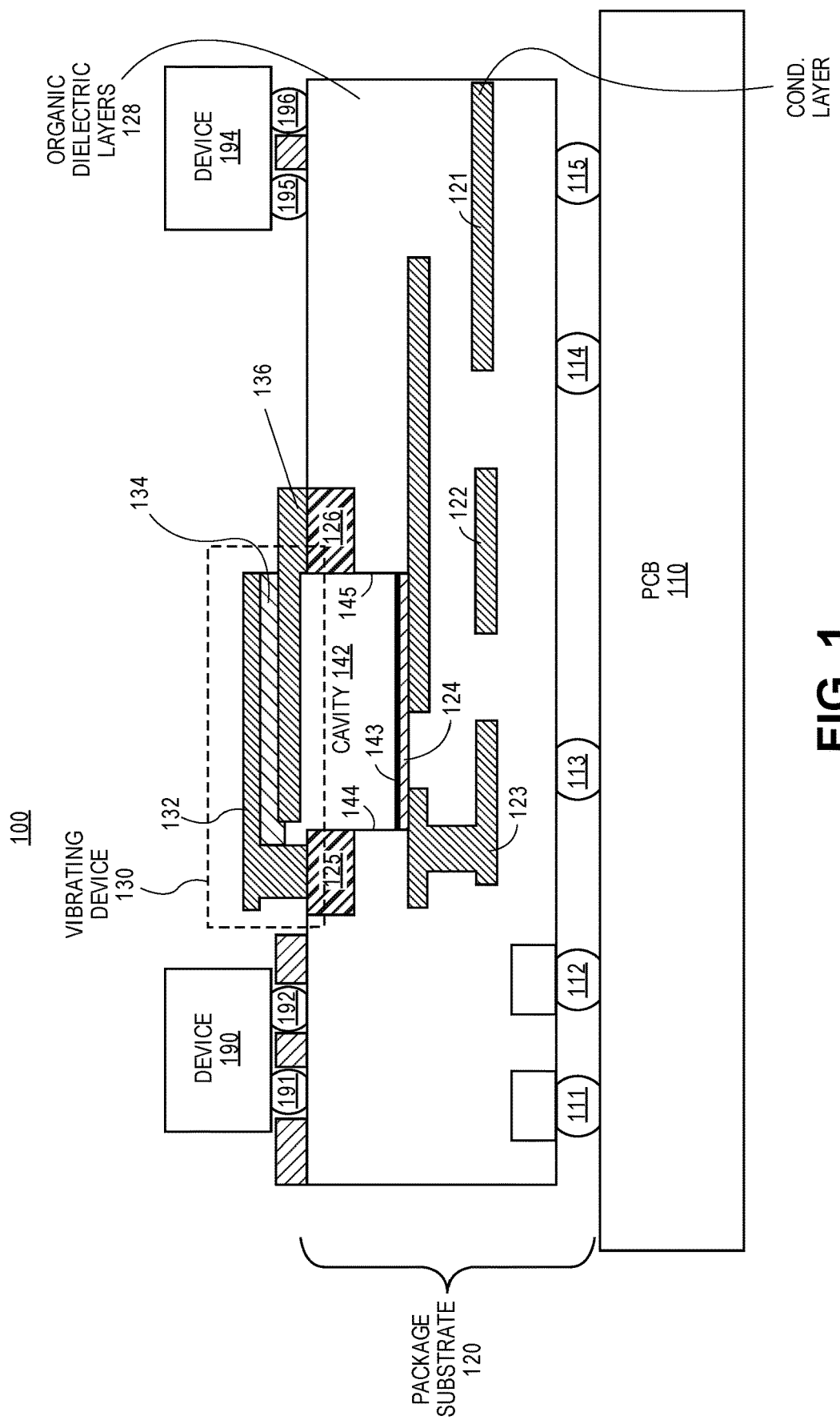
FIG. 1 illustrates a view of a microelectronic device 100 having a package-integrated piezoelectric device, according to an embodiment.

Described herein are piezoelectric package integrated contour mode filter devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Most filters today utilize integrated passive (resistor, capacitor, and/or inductor) networks which suffer from large size and low quality factors. Silicon micro-electromechanical (MEMS) resonators can be made smaller and have higher quality factors than passive filter networks, however their fabrication may be expensive due to the wafer-level nature of Si-MEMS processing. In addition, both of those approaches (integrated passive networks and Si-MEMS resonators) require assembly of components to the system or board. The present design includes an architecture that allows in-situ fabrication of filter devices in a compact form factor on package substrates using organic panel-level (e.g., approximately 0.5 m×0.5 m sized panels) high volume manufacturing technology, without requiring the assembly of external bulky components or expensive Si MEMS fabrication.

The present design addresses the fabrication of filter devices within the semiconductor package substrate that is compatible with high volume package substrate fabrication technology. This present design for MEMS filter devices integrated in a package substrate is based on our ability to deposit piezoelectric materials in the package substrate and create vibrating structures in the substrate.

In one embodiment, this technology allows the fabrication of micro-electromechanical piezoelectric filter devices utilizing substrate manufacturing technology. These filter devices include suspended vibrating structures. The structures contain stacks of piezoelectric material and electrodes that can be used to apply a voltage to the piezoelectric layer. Applying a voltage across the electrodes produces a stress in the piezoelectric material, causing the stack to vibrate. This in turn produces the mechanical displacement needed to change an effective capacitance for use in filtering devices in the microelectronic system.

The present design results in package-integrated filter devices, thus enabling smaller and thinner systems in comparison to discrete filter devices attached to a substrate. The package-integrated filter devices do not add a Z height (along the vertical axis) to a total height of a substrate or multiple substrates. This present design can be manufactured as part of the substrate fabrication process with no need for purchasing and assembling discrete components. It therefore enables high volume manufacturability (and thus lower costs) of systems that need filter devices (e.g., RF filters, etc).

In one example, the present design includes package-integrated structures to act as radio frequency (RF) filter devices. Those structures are manufactured as part of the package layers and are made free to vibrate or move by removing the dielectric material around them. The structures include piezoelectric stacks that are deposited and patterned layer-by-layer into the package. The present design includes creating functional filters in the package on the principle of suspended and vibrating structures. Etching of the dielectric material in the package occurs to create cavities. Piezoelectric material deposition (e.g., 0.5 to 1 um deposition thickness) and crystallization also occurs in the package substrate during the package fabrication process. An annealing operation at a lower substrate temperature range (e.g., up to 260 C) allows crystallization of the piezoelectric material (e.g., lead zirconate, titanate (PZT), sodium potassium niobate, AlN, ZnO, etc) to occur during the package fabrication process. In one example, laser pulse annealing occurs locally with respect to the piezoelectric material for the annealing operation without damaging other layers of the package substrate (e.g., organic substrate) including organic layers.

The present design is able to create filters directly in the package without requiring the assembly of discrete components, to achieve higher quality factors (e.g., Q equal to or greater than 100) compared to LC tank filters, and to create multiple filters with different natural frequencies in the same process operation using lithographically defined features. This present design is advantageous compared to FBARs (film bulk acoustic resonators) which have frequency that is controlled by the film thickness and thus different layers or devices are needed for different center frequencies.

The present design has less stringent requirements on controlling the film thickness compared to FBARs (film bulk acoustic resonators) since the in-plane dimensions define the resonant frequency, not the film thickness as in the FBAR case. The present design enables filters that can be fabricated using organic panel level processing which is less expensive than wafer-level Si MEMS fabrication.

Referring now to FIG. 1, a view of a microelectronic device 100 having package-integrated piezoelectric devices is shown, according to an embodiment. In one example, the microelectronic device 100 includes multiple devices 190 and 194 (e.g., die, chip, CPU, silicon die or chip, radio transceiver, etc.) that are coupled or attached to a package substrate 120 (or printed circuit board 110) with solder balls 191-192, 195-196). The package substrate 120 is coupled or attached to the printed circuit board (PCB) 110 using, for example, solder balls 111 through 115.

The package substrate 120 (e.g., organic substrate) includes organic dielectric layers 128 and conductive layers 121-126. Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 120 can be formed during package substrate processing (e.g., panel level). The panels formed can be large (e.g., having in-plane dimensions of approximately 0.5 meter by 0.5 meter, or greater than 0.5 meter, etc.) for lower cost. A cavity 142 is formed within the packaging substrate 120 by removing one or more layers (e.g., organic layers, dielectric layers, etc.) from the packaging substrate 120. The cavity 142 includes a lower member 143 and sidewalls 144-145. In one example, a piezoelectric vibrating device 130 is formed with conductive structures 132 and 136 (e.g., cantilevers, beams) and piezoelectric material 134. The three structures 132, 134, and 136 form a stack. The conductive layer 132 can act as a first electrode and the conductive layer 136 can act as a second electrode of the piezoelectric vibrating device. The cavity 142 can be air filled or vacuum filled. Applying a voltage across the first and second electrodes produces a stress in the piezoelectric material, causing the entire stack to vibrate (e.g., horizontally, etc.). This in turn produces the mechanical displacement needed for resonator filtering.

Figure 2:
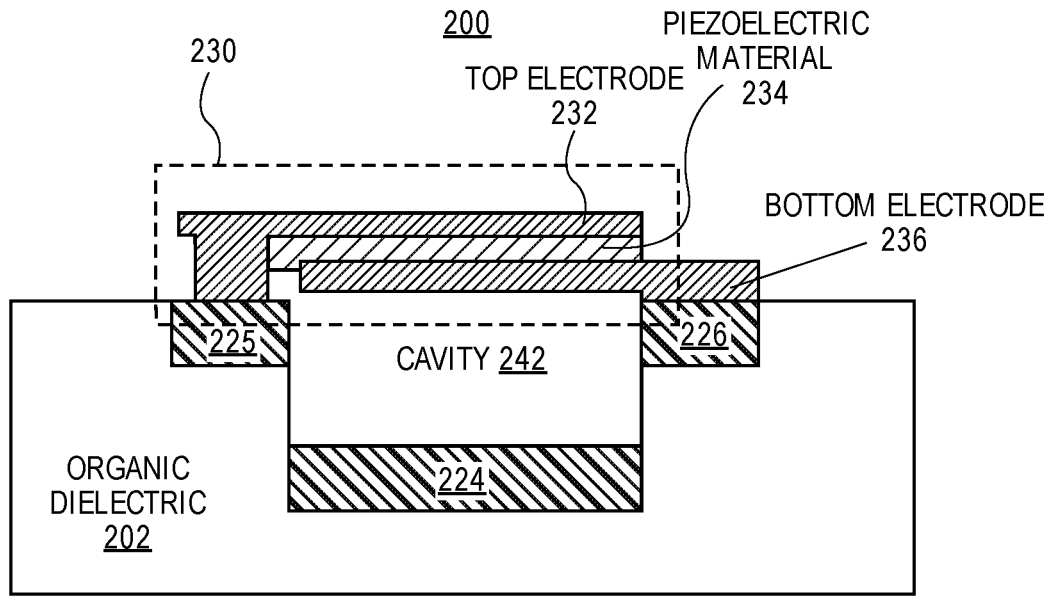
FIG. 2 illustrates a package substrate having a package-integrated piezoelectric filter device, according to an embodiment.

The basic principle includes creating a low power, low cost electromechanical filter using a contour mode piezoelectric resonator integrated in the package substrate. FIG. 2 illustrates a package substrate having a package-integrated piezoelectric filter device, according to an embodiment. In one example, the package substrate 200 may be coupled or attached to multiple devices (e.g., die, chip, CPU, silicon die or chip, RF transceiver, etc.) and also coupled or attached to a printed circuit board (e.g., PCB 110). The package substrate 200 (e.g., organic substrate) includes organic dielectric layers 202 and conductive layers 224-226, 232, and 236. The package substrate 200 can be formed during package substrate processing (e.g., panel level). A cavity 242 is formed within the packaging substrate 200 by removing one or more layers (e.g., organic layers, dielectric layers, etc.) from the packaging substrate 200. In one example, a piezoelectric filter device 230 (e.g., resonator) is formed with conductive vibrating structures 232 and 236 and piezoelectric material 234. The conductive layer 232 can act as a first top electrode and the conductive layer 236 can act as a second bottom electrode of the piezoelectric device. In one example, the piezoelectric material 234 is disposed on the bottom electrode and the top electrode is disposed on the material 234. The cavity 242 can be air filled or vacuum filled. The conductive layer 232 is anchored on one edge by package connections 225 (e.g., anchors, vias) which may serve as both mechanical anchors as well as electrical connections to the rest of the package. The conductive layer 236 is anchored on one edge by package connections 226 (e.g., anchors, vias) which may serve as both mechanical anchors as well as electrical connections to the rest of the package.

Figure 3:
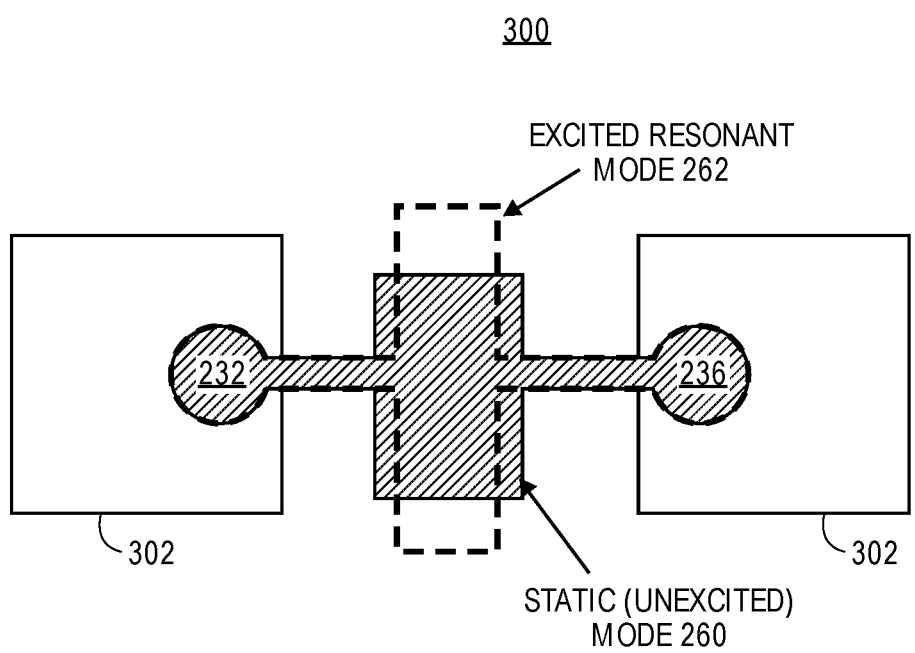
FIG. 3 illustrates a top view of a package substrate having a package-integrated piezoelectric filter device (e.g., resonator), according to an embodiment.
Figure 4:
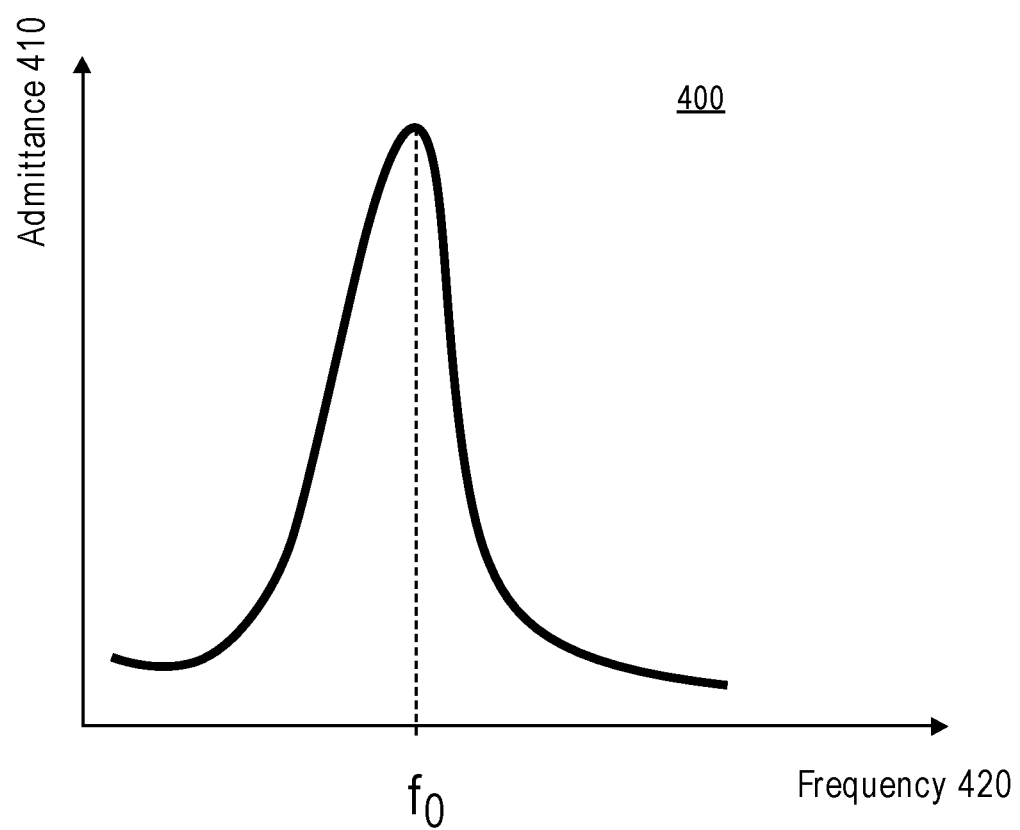
FIG. 4 illustrates a graph of effective electrical admittance 410 (vertical axis) versus frequency 420 (horizontal axis) with natural resonant frequency $f_0$ in accordance with one embodiment.

This kind of resonator has in-plane resonant modes (e.g., static unexcited mode 260, excited resonant mode 262, for example as shown schematically in FIG. 3). FIG. 3 illustrates a top view of a package substrate having a package-integrated piezoelectric filter device (e.g., resonator), according to an embodiment. The package substrate 300 (e.g., organic substrate) includes organic dielectric layers 302 (or layers 202) and conductive layers 224-226, 232, and 236. The package substrate 300 can be formed during package substrate processing (e.g., panel level). The natural frequency $f_0$ of this resonant mode is controlled by lithographically defined in-plane dimensions of the design. The top and bottom electrodes 232 and 236 and piezoelectric material 234 change physically from a static unexcited shape at mode 260 to an elongated shape at excited resonant mode 262 which changes an effective capacitance of this device. Due to the electromechanical coupling in the device 230 which is due to the piezoelectric effect, the effective electrical admittance to incoming electrical signals peaks at this natural frequency $f_0$ as shown schematically in FIG. 4, enabling the device to act as a filter in accordance with one embodiment. FIG. 4 illustrates a graph of effective electrical admittance 410 (vertical axis) versus frequency 420 (horizontal axis) with natural resonant frequency $f_0$. Admittance is a measure of how easily a circuit or device will allow a current to flow. Admittance is the inverse of impedance. Moreover, since the resonant frequency is controlled by in-plane (e.g., lithographically defined) features, this allows for the parallel creation of multiple filters with different resonant frequencies in the same substrate layer using the same process operation due to different lithographically defined features (e.g., different dimensions of the features). This in turn can be utilized to create circuits that are selective to a single frequency or to multiple frequencies (e.g., high pass, low pass, or bandpass filters, etc).

The present design uses substrate manufacturing technology to create a piezoelectric resonator. The resonator consists of a stack containing a piezoelectric material (e.g., lead zirconate titanate (PZT), sodium potassium niobate, aluminum nitride (AlN), zinc oxide (ZnO), etc) sandwiched between two electrodes made for example from Cu, Pt, or other metal. The resonator sits on top of a cavity that is created by removing some of the organic dielectric material in the package (e.g., using reactive ion etching, laser ablation, or other methods). Applying an electrical signal across the electrodes causes the stack to expand and contract laterally (i.e., in plane). When the frequency of the electrical signal matches the mechanical resonant frequency of the structure, the in-plane deformations are maximized leading to a maximum electrical admittance seen by the signal, as shown schematically in FIG. 4. This allows the device to act as a filter that only allows electrical signals at this resonant frequency to be transmitted across it while severely attenuating signals at other frequencies.

Figure 5A:
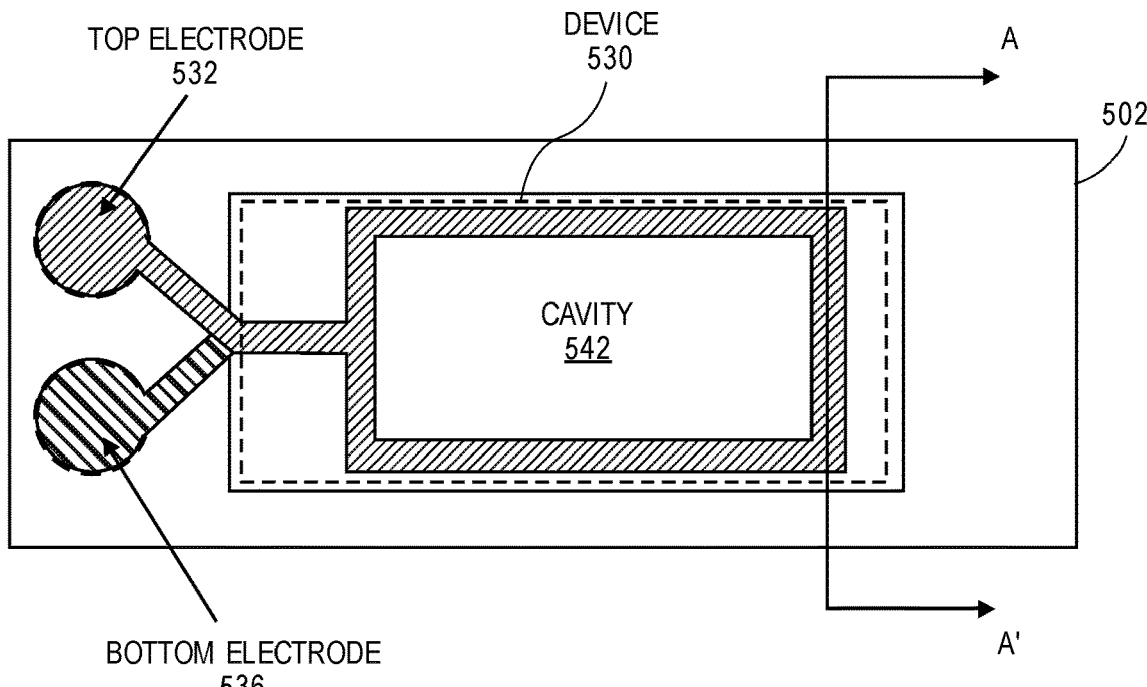
FIG. 5A illustrates a top view of a package substrate 500 having a package-integrated piezoelectric filter device (e.g., resonator), according to an embodiment.
Figure 5B:
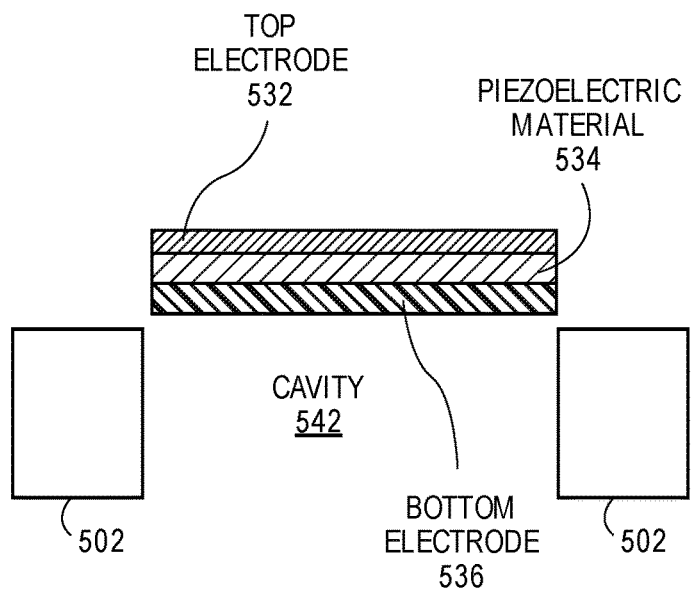
FIG. 5B illustrates a cross sectional view AA' of the piezoelectric device of FIG. 5A in accordance with one embodiment.
Figure 6A:
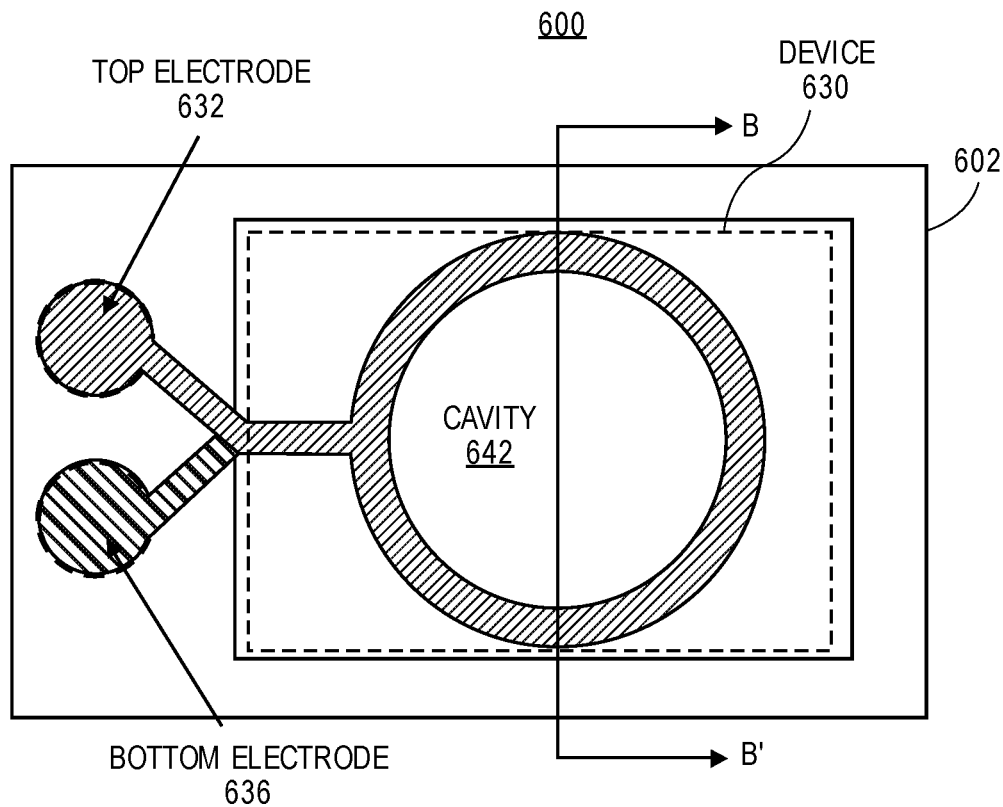
FIG. 6A illustrates a top view of a package substrate 600 having a package-integrated piezoelectric filter device (e.g., resonator), according to an embodiment.
Figure 6B:
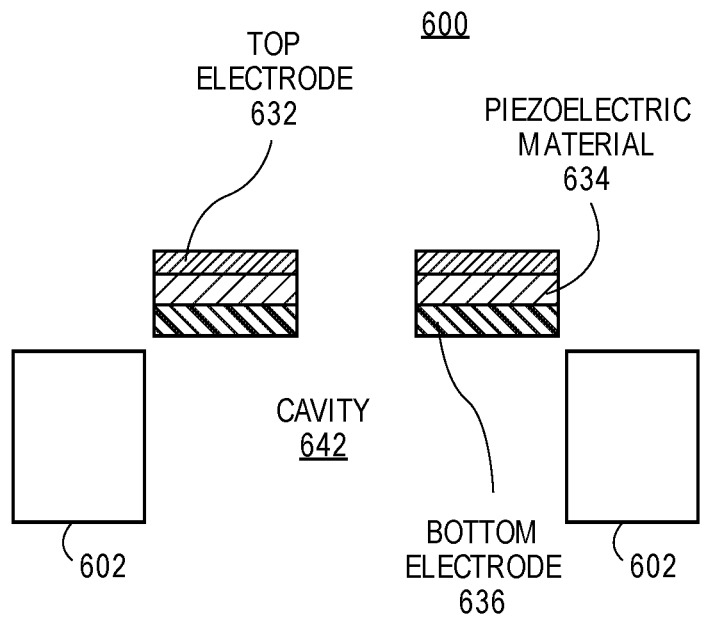
FIG. 6B illustrates a cross sectional view BB' of the piezoelectric device of FIG. 6A.

Although the design shown in FIG. 3 includes a rectangular plate, any other type of design (e.g., any lithographically defined feature) is also possible, such as, for example, a picture frame structure in FIGS. 5A and 5B, or the ring structure in FIGS. 6A and 6B. The tethers connecting those structures to other traces or vias in the package for electrical connectivity can be either on the same side (e.g., FIGS. 5A and 6A) or on different sides of the structure (e.g., FIG. 2).

FIG. 5A illustrates a top view of a package substrate 500 having a package-integrated piezoelectric filter device (e.g., resonator), according to an embodiment. The package substrate 500 (e.g., organic substrate) includes organic dielectric layers 502 and conductive layers (e.g., 532, 536). The package substrate 500 can be formed during package substrate processing (e.g., panel level). The natural frequency $f_0$ of this resonant mode is controlled by lithographically defined in-plane dimensions of the design. The top and bottom electrodes 532 and 536 and piezoelectric material 534 change physically while suspended above a cavity 542 from a static unexcited shape at a first mode to a different shape (e.g., an elongated shape, or an increased or decreased frame width) at an excited resonant second mode which changes an effective capacitance of this device. Due to the electromechanical coupling in the device 530 which is due to the piezoelectric effect, the effective electrical admittance to incoming electrical signals peaks at this natural frequency $f_0$ as shown schematically in FIG. 4, enabling the device to act as a filter in accordance with one embodiment.

FIG. 5B illustrates a cross sectional view AA' of the piezoelectric device of FIG. 5A. The view AA' illustrates an organic dielectric material 502, electrodes 532 and 536, piezoelectric material 534, and a cavity 542. A piezoelectric stack can include a sandwich configuration in which the piezoelectric material 534 is deposited between two electrodes 532 and 536.

FIG. 6A illustrates a top view of a package substrate 600 having a package-integrated piezoelectric filter device (e.g., resonator), according to an embodiment. The package substrate 600 (e.g., organic substrate) includes organic dielectric layers 602 and conductive layers (e.g., 632, 636). The package substrate 600 can be formed during package substrate processing (e.g., panel level). The top and bottom electrodes 632 and 636 and piezoelectric material 634 change physically while suspended above a cavity 642 from a static unexcited shape at a first mode to a different shape (e.g., width of ring increases or decreases) at an excited resonant second mode which changes an effective capacitance of this device. Due to the electromechanical coupling in the device 630 which is due to the piezoelectric effect, the effective electrical admittance to incoming electrical signals peaks at this natural frequency $f_0$ as shown schematically in FIG. 4, enabling the device to act as a filter in accordance with one embodiment.

FIG. 6B illustrates a cross sectional view BB' of the piezoelectric device of FIG. 6A. The view BB' illustrates an organic dielectric material 602, electrodes 632 and 636, piezoelectric material 634, and a cavity 642. A piezoelectric stack can include a sandwich configuration in which the piezoelectric material 634 is deposited between two electrodes 632 and 636.

Due to the natural frequency depending on the in-plane dimensions and design of the resonator, multiple resonators having different frequencies can be fabricated in the same process operation, simply by including different designs in the mask used for lithography. This is a significant advantage compared to FBAR filters which have frequency depending on the thickness of the film, and which therefore require filters with different frequencies to be fabricated in multiple (different) process operations.

Figure 7A:
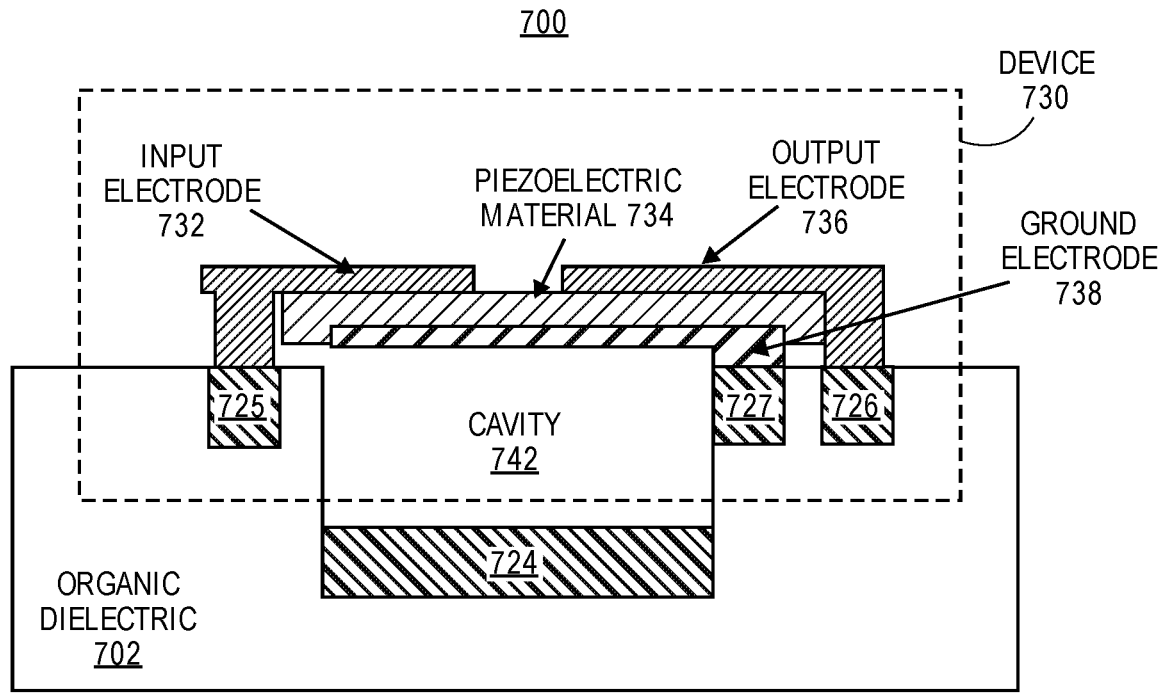
FIG. 7A illustrates a package substrate having a package-integrated piezoelectric filter device with two ports, according to an embodiment.
Figure 7B:
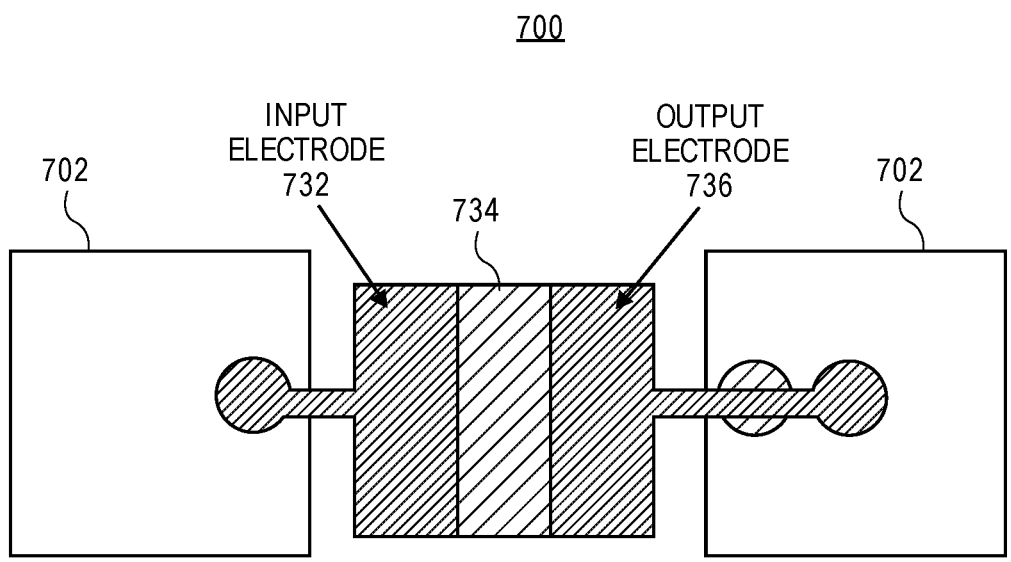
FIG. 7B illustrates a top view of a package substrate having a package-integrated piezoelectric filter device (e.g., resonator), according to an embodiment.
Figure 8:
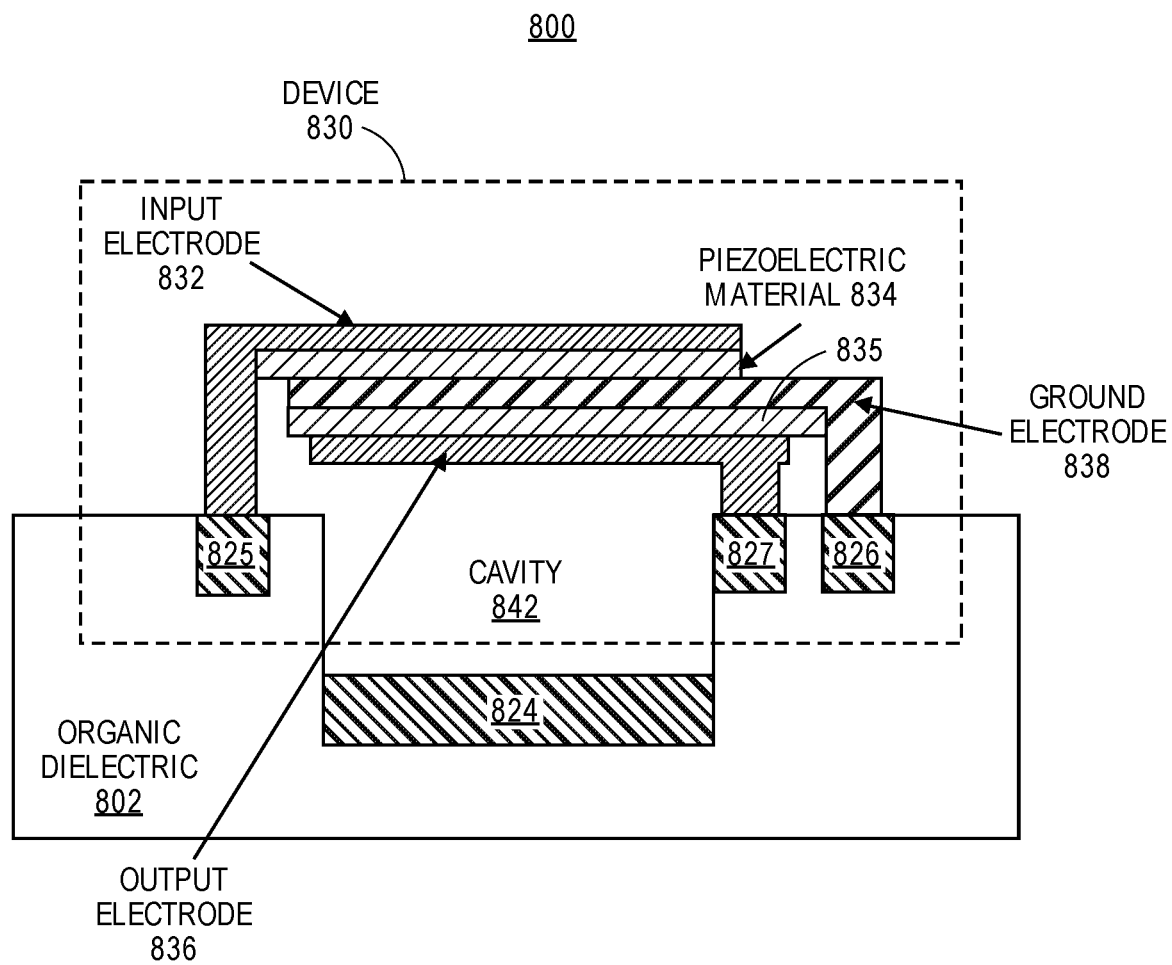
FIG. 8 illustrates a package substrate having a package-integrated piezoelectric filter device with two ports, according to an embodiment.

In addition to the single port resonators shown in FIGS. 1-3, 5A, 5B, 6A, and 6B, this design can also be applied towards creating dual port resonators where there are separate input and output electrodes as shown in FIGS. 7A, 7B, and 8.

FIG. 7A illustrates a package substrate having a package-integrated piezoelectric filter device with two ports, according to an embodiment. In one example, the package substrate 700 may be coupled or attached to multiple devices (e.g., die, chip, CPU, silicon die or chip, etc.) and also coupled or attached to a printed circuit board (e.g., PCB 110). The package substrate 700 (e.g., organic substrate) includes organic dielectric layers 702 and conductive layers 724-727, 732, 736, and 738. The package substrate 700 can be formed during package substrate processing (e.g., panel level). A cavity 742 is formed within the packaging substrate 700 by removing one or more layers (e.g., organic layers, dielectric layers, etc.) from the packaging substrate 700. In one example, a piezoelectric filter device 730 (e.g., resonator) is formed with conductive structures 732, 736, and 738 and piezoelectric material 734. The conductive structure 732 can act as an input electrode, the conductive structure 736 can act as an output electrode, and the conductive structure 738 can act as a ground electrode of the piezoelectric device 730. The cavity 742 can be air filled or vacuum filled.

This kind of resonator has in-plane resonant modes (e.g., static unexcited mode, excited resonant mode). FIG. 7B illustrates a top view of a package substrate having a package-integrated piezoelectric filter device (e.g., resonator), according to an embodiment. The package substrate 700 (e.g., organic substrate) includes organic dielectric layers 702 and conductive layers 724-727, 732, 736, and 738. The input, output, and ground electrodes 732, 736, and 738 and piezoelectric material 734 change physically from a static unexcited shape at a first mode to an elongated shape at excited resonant second mode which changes an effective capacitance of this device.

Two port configurations provide the advantage of electrical isolation between the input and output terminals compared to one port configurations, which can be critical at high frequencies. In the example shown in FIGS. 7A and 7B, two electrodes, one for input and one for output, are positioned laterally on either side of the structure, and both have an underlying piezoelectric layer which sits on top of a ground electrode. An electrical signal at the resonant frequency of the device received at the input electrode drives the structure into resonance, producing an output signal that is picked up by the output electrode and transmitted to other components in the package.

FIG. 8 illustrates a package substrate having a package-integrated piezoelectric filter device with two ports, according to an embodiment. In one example, the package substrate 800 may be coupled or attached to multiple devices (e.g., die, chip, CPU, silicon die or chip, etc.) and also coupled or attached to a printed circuit board (e.g., PCB 110). The package substrate 800 (e.g., organic substrate) includes organic dielectric layers 802 and conductive layers 824-827, 832, 836, and 838. The package substrate 800 can be formed during package substrate processing (e.g., panel level). A cavity 842 is formed within the packaging substrate 800 by removing one or more layers (e.g., organic layers, dielectric layers, etc.) from the packaging substrate 800. In one example, a piezoelectric filter device 830 (e.g., resonator) is formed with conductive structures 832, 836, and 838 and piezoelectric material 834 and 835. In one example, the piezoelectric material 834 and 835 each have a greater thickness than an adjacent thickness of the input and output electrodes. The conductive layer 832 can act as an input electrode, the conductive layer 836 can act as an output electrode, and the conductive layer 838 can act as a ground electrode of the piezoelectric device 830. The cavity 842 can be air filled or vacuum filled.

FIG. 8 illustrates a resonator having input and output electrodes positioned vertically on opposite sides of the ground electrode. In this case, two layers of piezoelectric materials are needed on either side of the ground electrode as shown. Those configurations are also not limited to rectangular plate shaped structures, and may include other designs such as picture frame and ring structures with tethers on the same or different sides of the structure as for the single port resonators described above.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 9:
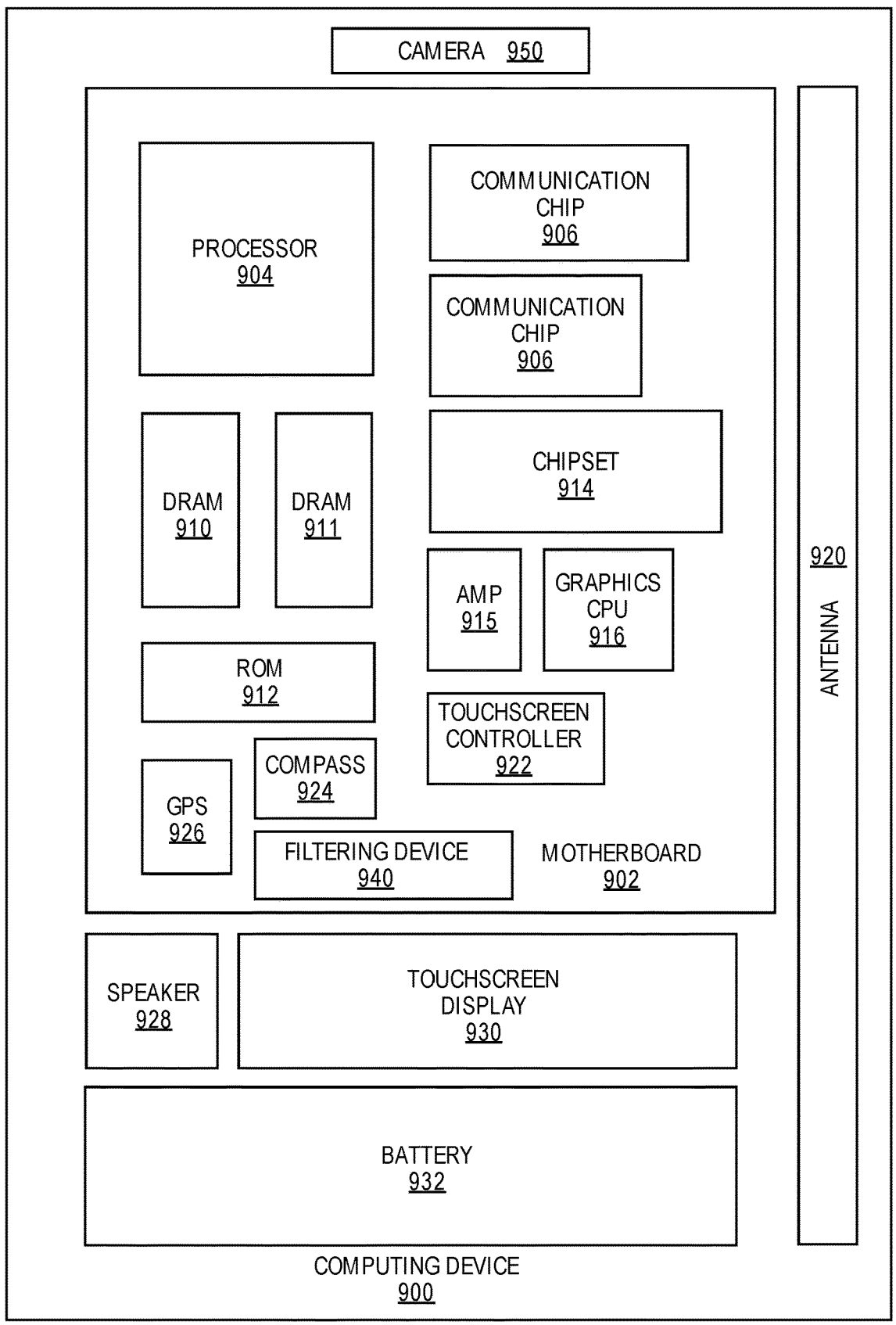
FIG. 9 illustrates a computing device 900 in accordance with one embodiment.

FIG. 9 illustrates a computing device 900 in accordance with one embodiment of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna 920, a display, a touchscreen display 930, a touchscreen controller 922, a battery 932, an audio codec, a video codec, a power amplifier 915, a global positioning system (GPS) device 926, a compass 924, a filtering device 940 (e.g., a piezoelectric vibrating device), a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig and Bluetooth and a second communication chip 906 may be dedicated to longer range wireless communications such as GPS, EDGE, GPRS, CDMA, WiMAX, LTE, Ev-DO, 5G, and others.

The processor 904 of the computing device 900 includes an integrated circuit die packaged within the processor 904. In some implementations of the invention, the processor package includes one or more devices, such as filtering devices in accordance with implementations of embodiments of the invention. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906.

The following examples pertain to further embodiments. Example 1 is A filtering device comprising a vibrating stack that includes a first electrode, a piezoelectric material in contact with the first electrode, and a second electrode in contact with the piezoelectric material. The vibrating stack expands and contracts laterally in a plane of an organic substrate having organic layers in response to application of an electrical signal to the piezoelectric material between the first and second electrodes.

In example 2, the subject matter of example 1 can optionally include the filtering device being integrated with the organic substrate which is fabricated with panel level processing.

In example 3, the subject matter of any of examples 1-2 can optionally include the filtering device being positioned above a cavity of the organic substrate to allow vibrations of the stack.

In example 4, the subject matter of any of examples 1-3 can optionally include the first and second electrodes being biased with an electrical signal having a frequency approximately equal to a mechanical resonant frequency of the stack which contains the electrodes and the piezoelectric material in order to operate the filtering device at resonance to maximize electrical admittance.

In example 5, the subject matter of any of examples 1-4 can optionally include the vibrating stack having any type of in-plane shape defined by lithography during fabrication of the panel level organic substrate. Each shape is associated with a corresponding resonant frequency.

In example 6, the subject matter of any of examples 1-5 can optionally include the filtering device including a contour mode resonator with the resonator having a first static unexcited mode and an associated first shape and also a second excited resonant mode and an associated different second shape.

In example 7, the subject matter of any of examples 1-6 can optionally include the contour mode resonator including a single port design with the first electrode being coupled to a first electrical connection of the organic substrate in proximity to a first end of a cavity of the organic substrate and the second electrode being coupled to a second electrical connection of the organic substrate in proximity to a second end of the cavity.

In example 8, the subject matter of any of examples 1-6 can optionally include the contour mode resonator comprises a single port design with the first and second electrodes being coupled to first and second electrical connections respectively of the organic substrate in proximity to a first end of a cavity of the organic substrate.

Example 9 is a package substrate comprising a plurality of organic dielectric layers and a plurality of conductive layers to form the package substrate, a cavity formed in the package substrate, and a piezoelectric device integrated within the package substrate. The piezoelectric device includes an input electrode, an output electrode, and a ground electrode in contact with a piezoelectric material. The piezoelectric device oscillates in response to application of an input electrical signal between the input and ground electrodes.

In example 10, the subject matter of example 9 can optionally include the piezoelectric device being positioned above the cavity to allow oscillations of the piezoelectric device leading to the generation of an output electrical signal between the output electrode and the ground electrode.

In example 11, the subject matter of any of examples 9-10 can optionally include the input and ground electrodes being biased with an input electrical signal having a frequency approximately equal to a mechanical resonant frequency of the piezoelectric device in order to operate at resonance.

In example 12, the subject matter of any of examples 9-11 can optionally include the piezoelectric device including a dual port design with the input electrode being coupled to a first electrical connection in proximity to a first end of the cavity and the output electrode being coupled to a second electrical connection in proximity to a second end of the cavity.

Example 13 is a filtering device comprising an input electrode for receiving an input electrical signal, a first piezoelectric layer in contact with the input electrode, a ground electrode in contact with the first piezoelectric layer, a second piezoelectric layer in contact with the ground electrode, and an output electrode in contact with the second piezoelectric layer. The filtering device oscillates within an organic substrate in response to application of the input electrical signal between the input electrode and ground electrode.

In example 14, the subject matter of example 13 can optionally include the filtering device being integrated with the organic substrate which includes organic layers.

In example 15, the subject matter of any of examples 13-14 can optionally include the filtering device being positioned above a cavity of the organic substrate to allow oscillations of the filtering device leading to the generation of an output electrical signal between the output electrode and the ground electrode.

In example 16, the subject matter of any of examples 13-15 can optionally include the input and ground electrodes being biased with an input electrical signal having a frequency approximately equal to a mechanical resonant frequency of the filtering device in order to operate at resonance.

In example 17, the subject matter of any of examples 13-16 can optionally include the piezoelectric filtering device including a dual port design with the input electrode being coupled to a first electrical connection in proximity to a first end of the cavity and the output electrode being coupled to a second electrical connection in proximity to a second end of the cavity.

Example 18 is a computing device comprising at least one processor to process data and a package substrate coupled to the at least one processor. The package substrate includes a plurality of organic dielectric layers and a plurality of conductive layers to form the package substrate which includes a piezoelectric filtering device having a first electrode, a piezoelectric material in contact with the first electrode, and a second electrode in contact with the piezoelectric material. The piezoelectric filtering device expands and contracts laterally in a plane of the package substrate in response to application of an electrical signal between the first and second electrodes.

In example 19, the subject matter of example 18 can optionally include the filtering device being integrated with the organic package substrate having organic layers.

In example 20, the subject matter of any of examples 18-19 can optionally include a printed circuit board coupled to the package substrate.

The invention claimed is:

1. A filtering device, comprising:
a vibrating stack that includes a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein the vibrating stack expands and contracts laterally in a plane of an organic substrate having organic layers in response to application of an electrical signal to the piezoelectric material between the first and second electrodes, wherein the filtering device is positioned above a cavity of the organic substrate, wherein the first electrode extends only partially across the cavity, and wherein the first electrode is coupled directly to a first conductive structure in the organic substrate, and the second electrode is coupled directly to a second conductive structure in the organic substrate.

2. The filtering device of claim 1, wherein the filtering device is integrated with the organic substrate which is fabricated with panel level processing.

3. The filtering device of claim 2, wherein the filtering device is positioned above the cavity of the organic substrate to allow vibrations of the vibrating stack.

4. The filtering device of claim 2, wherein the first and second electrodes are biased with an electrical signal having a frequency approximately equal to a mechanical resonant frequency of the vibrating stack containing the first and second electrodes and the piezoelectric material in order to operate the filtering device at resonance to maximize electrical admittance.

5. The filtering device of claim 1, wherein the vibrating stack has any type of in-plane shape defined by lithography during fabrication of a panel level organic substrate, wherein each shape is associated with a corresponding resonant frequency.

6. The filtering device of claim 1, wherein the filtering device comprises a contour mode resonator with a resonator having a first static unexcited mode and an associated first shape and also a second excited resonant mode and an associated different second shape.

7. The filtering device of claim 6, wherein the contour mode resonator comprises a single port design with the first electrode being coupled to a first electrical connection of the organic substrate in proximity to a first end of the cavity of the organic substrate and the second electrode being coupled to a second electrical connection of the organic substrate in proximity to a second end of the cavity.

8. The filtering device of claim 6, wherein the contour mode resonator comprises a single port design with the first and second electrodes being coupled to first and second electrical connections respectively of the organic substrate in proximity to a first end of the cavity of the organic substrate.

9. A filtering device comprising:
an input electrode for receiving an input electrical signal;
a first piezoelectric layer in contact with the input electrode;
a ground electrode in contact with the first piezoelectric layer;
a second piezoelectric layer in contact with the ground electrode; and
an output electrode in contact with the second piezoelectric layer, wherein the filtering device oscillates within an organic substrate in response to application of the input electrical signal between the input electrode and ground electrode.

10. The filtering device of claim 9, wherein the filtering device is integrated with the organic substrate which includes organic layers.

11. The filtering device of claim 10, wherein the filtering device is positioned above a cavity of the organic substrate to allow oscillations of the filtering device leading to the generation of an output electrical signal between the output electrode and the ground electrode.

12. The filtering device of claim 9, wherein the input and ground electrodes are biased with the input electrical signal having a frequency approximately equal to a mechanical resonant frequency of the filtering device in order to operate at resonance.

13. The filtering device of claim 9, wherein the filtering device comprises a dual port design with the input electrode being coupled to a first electrical connection in proximity to a first end of the cavity and the output electrode being coupled to a second electrical connection in proximity to a second end of the cavity.

14. A computing device comprising:
at least one processor to process data; and
a package substrate coupled to the at least one processor, the package substrate includes a plurality of organic dielectric layers and a plurality of conductive layers to form the package substrate which includes a piezoelectric filtering device having a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein the piezoelectric filtering device expands and contracts laterally in a plane of the package substrate in response to application of an electrical signal between the first and second electrodes, wherein the piezoelectric filtering device is positioned above a cavity of the package substrate, wherein the first electrode extends only partially across the cavity, and wherein the first electrode is coupled directly to a first conductive structure in the package substrate, and the second electrode is coupled directly to a second conductive structure in the package substrate.

15. The computing device of claim 14, wherein the filtering device is integrated with the organic package substrate having organic layers.

16. The computing device of claim 14, further comprising:
a printed circuit board coupled to the package substrate.

17. A filtering device, comprising:
a vibrating stack that includes a first electrode, a piezoelectric material in contact with the first electrode, and a second electrode in contact with the piezoelectric material, wherein the vibrating stack expands and contracts laterally in a plane of an organic substrate having organic layers in response to application of an electrical signal to the piezoelectric material between the first and second electrodes, wherein the filtering device comprises a contour mode resonator with a resonator having a first static unexcited mode and an associated first shape and also a second excited resonant mode and an associated different second shape, wherein the contour mode resonator comprises a single port design with the first electrode being coupled to a first electrical connection of the organic substrate in proximity to a first end of a cavity of the organic substrate and the second electrode being coupled to a second electrical connection of the organic substrate in proximity to a second end of the cavity.

18. A filtering device, comprising:

a vibrating stack that includes a first electrode, a piezoelectric material in contact with the first electrode, and a second electrode in contact with the piezoelectric material, wherein the vibrating stack expands and contracts laterally in a plane of an organic substrate having organic layers in response to application of an electrical signal to the piezoelectric material between the first and second electrodes, wherein the filtering device comprises a contour mode resonator with a resonator having a first static unexcited mode and an associated first shape and also a second excited resonant mode and an associated different second shape, wherein the contour mode resonator comprises a single port design with the first and second electrodes being coupled to first and second electrical connections respectively of the organic substrate in proximity to a first end of a cavity of the organic substrate.

19. A filtering device, comprising:

a vibrating stack that includes a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein the vibrating stack expands and contracts laterally in a plane of an organic substrate having organic layers in response to application of an electrical signal to the piezoelectric material between the first and second electrodes, wherein the filtering device comprises a contour mode resonator with a resonator having a first static unexcited mode and an associated first shape and also a second excited resonant mode and an associated different second shape.

* * * * *